(12) United States Patent
Ko (10) Patent No.: US 10,679,715 B2
(45) Date of Patent: Jun. 9, 2020

(54) NONVOLATILE MEMORY APPARATUS AND OPERATING METHOD OF THE NONVOLATILE MEMORY APPARATUS

(71) Applicant: SK hynix Inc., Icheon-si, Gyeonggi-do (KR)

(72) Inventor: Keun Sik Ko, Seongnam-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 16/184,817

(22) Filed: Nov. 8, 2018

(65) Prior Publication Data

US 2019/0325976 A1 Oct. 24, 2019

(30) Foreign Application Priority Data

Apr. 23, 2018 (KR) .......................... 10-2018-0046541

(51) Int. Cl.
| | |
|---|---|
| *G11C 17/18* | (2006.01) |
| *G11C 7/06* | (2006.01) |
| *G11C 7/08* | (2006.01) |
| *G11C 7/22* | (2006.01) |
| *G11C 17/16* | (2006.01) |
| *G11C 7/12* | (2006.01) |

(52) U.S. Cl.
CPC .............. *G11C 17/18* (2013.01); *G11C 7/065* (2013.01); *G11C 7/08* (2013.01); *G11C 7/12* (2013.01); *G11C 7/22* (2013.01); *G11C 17/165* (2013.01)

(58) Field of Classification Search
None
See application file for complete search history.

(56) References Cited

U.S. PATENT DOCUMENTS

| 8,947,947 B2 | 2/2015 | Jeong et al. | |
|---|---|---|---|
| 2014/0313840 A1* | 10/2014 | Hwang | ................ G11C 29/785 365/200 |
| 2015/0221392 A1* | 8/2015 | Kim | ....................... G11C 17/16 365/96 |
| 2015/0279473 A1* | 10/2015 | Yoo | ......................... G11C 16/28 365/185.18 |
| 2018/0059938 A1* | 3/2018 | Kang | ................... G11C 11/1655 |

FOREIGN PATENT DOCUMENTS

KR 1020150067570 A 6/2015

* cited by examiner

*Primary Examiner* — Douglas King
(74) *Attorney, Agent, or Firm* — William Park & Associates Ltd.

(57) ABSTRACT

A nonvolatile memory apparatus may include a first memory cell array, a second memory cell array, and a data sensing circuit. The first memory cell array may include a plurality of first memory cells coupled between a plurality of first word lines and a bit line. The second memory cell array may include a plurality of second memory cells coupled between a plurality of second word lines and the bit line. The data sensing circuit may define a sensing period and a latch period based on a power-up signal, may precharge a sensing node coupled to the bit line, may sense and amplify a voltage level of the sensing node, during the sensing period, and may generate an output signal by latching the sensed and amplified signal during the latch period.

12 Claims, 6 Drawing Sheets

FIG.7

NONVOLATILE MEMORY APPARATUS AND OPERATING METHOD OF THE NONVOLATILE MEMORY APPARATUS

CROSS-REFERENCES TO RELATED APPLICATION

The present application claims priority under 35 U.S.C. § 119(a) to Korean application number 10-2018-0046541, filed on Apr. 23, 2018, in the Korean Intellectual Property Office, which is incorporated herein by reference in its entirety.

BACKGROUND

1. Technical Field

Various embodiments of the present disclosure relate to an integrated circuit technology and, more particularly, to a semiconductor apparatus and a nonvolatile memory device.

2. Related Art

An electronic device includes many electronic elements, and a computer system includes many semiconductor apparatuses, each including many semiconductors. The semiconductor apparatuses may include nonvolatile memory apparatuses and may store information related to operations of the semiconductor apparatuses. The nonvolatile memory apparatuses may include a Read Only Memory (ROM), a Programmable Read Only Memory (PROM), an Erasable Programmable Read Only Memory (EPROM), an Electrically Erase and Programmable Read Only Memory (EEPROM), a One Time Programmable (OTP) memory, etc.

Among the above-described nonvolatile memory apparatuses, the OTP memory includes a fuse array as a memory cell array. The fuse array includes a plurality of fuses and stores various data according to program statuses of the fuses. The fuses may include a physical fuse and an electrical fuse. Between them, the electrical fuse is widely used in the field of the semiconductor apparatus technology. An anti-fuse is an example of the electrical fuse. The anti-fuse may be programmed through an electrical signal. The anti-fuse using the metal-oxide-semiconductor (MOS) transistor may be programmed through the breakdown of the gate oxide of the MOS transistor. Data stored in the anti-fuse is read through sensing of the breakdown status of the anti-fuse.

SUMMARY

In accordance with an embodiment of the present disclosure, a nonvolatile memory apparatus includes a first memory cell array, a second memory cell array, and a data sensing circuit. The first memory cell array includes a plurality of first memory cells coupled between a plurality of first word lines and a bit line. The second memory cell array includes a plurality of second memory cells coupled between a plurality of second word lines and the bit line. The data sensing circuit is configured to define a sensing period and a latch period based on a power-up signal, to precharge a sensing node coupled to the bit line, to sense and amplify a voltage level of the sensing node, during the sensing period, and to generate an output signal by latching the sensed and amplified signal in the latch period.

In accordance with another embodiment of the present disclosure, an operating method of a nonvolatile memory apparatus including a first memory cell array coupled to a sensing node through a bit line includes generating a sensing enable signal based on a power-up signal. The operating method further includes generating an amplification signal by comparing a voltage level of the sensing node with a reference voltage based on the sensing enable signal. The operating method additionally includes generating a latch enable signal, which is enabled in an enable period of the sensing enable signal. The operating method also includes generating an output signal by latching the amplification signal based on the latch enable signal.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION

A semiconductor apparatus according to the present disclosure is described below with reference to embodiments illustrated by the accompanying drawings.

Figure 1:
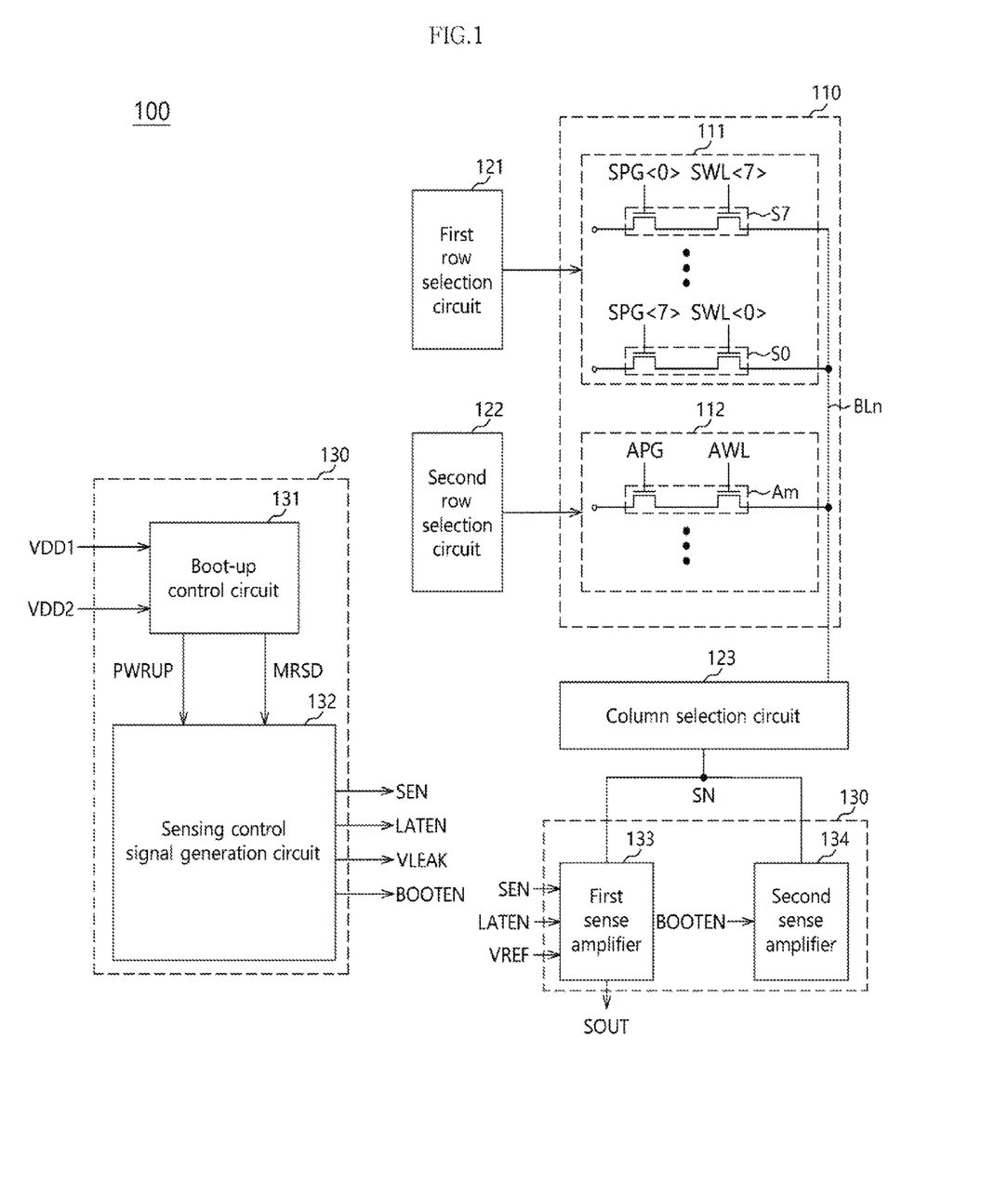
FIG. 1 shows a diagram illustrating a configuration of a nonvolatile memory apparatus, in accordance with an embodiment of the present disclosure.

FIG. 1 shows a diagram illustrating a configuration of a nonvolatile memory apparatus 100, in accordance with an embodiment of the present disclosure. Referring to FIG. 1, the nonvolatile memory apparatus 100 may include a memory cell array 110. The memory cell array 110 may include a plurality of word lines, a plurality of bit lines, and a plurality of memory cells coupled to cross points between the plurality of word lines and the plurality of bit lines. The plurality of memory cells may include nonvolatile memory cells. For example, the memory cells may be fuse cells and the fuse cells may include electrical fuses and/or anti-fuses. Embodiments are not limited to a particular type of memory cell and the plurality of memory cells may represent any kind of known nonvolatile memory cells. The memory cell array 110 may include a first memory cell array 111 and a second memory cell array 112. The first memory cell array 111 may include a plurality of word lines SWL<0:7> (SWL<0> . . . SWL<7> as shown; also referred to as first word lines) and a bit line BLn (n is an integer equal to or greater than zero (0)). The second memory cell array 112 may include a plurality of word lines AWL (also referred to as second word lines) and the bit line BLn.

The first memory cell array 111 and the second memory cell array 112 may share the bit line BLn. That is, the plurality of word is lines SWL<0:7> of the first memory cell array 111 and the plurality of word lines AWL of the second memory cell array 112 may be commonly coupled to the bit line BLn. The first memory cell array 111 may store first information and the second memory cell array 112 may store second information. The first information and the second information may be the same or different kinds of data. For example, the first information may be operation setting information of a semiconductor apparatus including the nonvolatile memory apparatus 100. The second information may be defect information and/or repair information of the semiconductor apparatus. In one instance, the first information may include information to set levels of voltages used for programming data into the second memory cell array 112 or for reading data stored in the second memory cell array 112 according to the second information.

The first memory cell array 111 may include first to eighth memory cells S0 to S7 (S0 . . . S7 as shown). Embodiment are not limited to any particular number of memory cells (also referred to as first memory cells) included in the first memory cell array 111. The first to eighth memory cells S0 to S7 may form a group. For example, impedance values and/or resistance values of the first to eighth memory cells S0 to S7 may be combined to form a single piece of data. Although not illustrated, the first memory cell array 111 may further include memory cells forming a plurality of groups. The memory cells of the first memory cell array 111 may receive assigned program signals among first to eighth program signals SPG<0:7>, and may receive a word line selection signal or may be coupled to the plurality of word lines SWL<0:7>(SPG<0>. . . SPG<7>as shown). The first to eighth program signals SPG<0:7>may be applied to program or read the first to eighth memory cells S0 to S7. The first to eighth program signals SPG<0:7>may have a first predetermined voltage level in order to program the first to eighth memory cells S0 to S7. The first to eighth program signals SPG<0:7>may have a second predetermined voltage level in order to allow currents to flow through the first to eighth memory cells S0 to S7 for reading statuses of the first to eighth memory cells S0 to S7. The first predetermined voltage level may be equal to or higher than the second predetermined voltage level. When the plurality of word lines SWL<0:7>are enabled, the first to eighth memory cells S0 to S7 may be respectively coupled to the bit line BLn. The first memory cell S0, for example, may receive the first program signal SPG<O> and may be coupled to the first word line SWL<0>. The eighth memory cell S7 may receive the eighth program signal SPG<7>and may be coupled to the eighth word line SWL<7>.

The second memory cell array 112 may include memory cells Am (m is an integer greater than zero (0)). The memory cells Am (also referred to as second memory cells) may receive another program signal APG and may be coupled to the plurality of word lines AWL. The first to eighth program signals SPG<0:7> and the program signal APG may be generated based on address signals different from each other. The plurality of word lines SWL<0:7> and the plurality of word lines AWL may be enabled on the basis of address signals different from each other. The nonvolatile memory apparatus 100 may further include a first row selection circuit 121 and a second row selection circuit 122. The first row selection circuit 121 may generate the first to eighth program signals SPG<0:7>and may enable the plurality of word lines SWL<0:7>. The second row selection circuit 122 may generate another program signal APG and may enable the plurality of word lines AWL. The first to eighth memory cells S0 to S7 and the memory cells Am may be programmed on the basis of the first to eighth program signals SPG<0:7>and the program signal APG. For example, the first to eighth memory cells S0 to S7 and the memory cells Am may be set to have different resistance values to store data. For example, when the first to eighth memory cells S0 to S7 and the memory cells Am are electrical fuses and/or anti-fuses, the first to eighth memory cells S0 to S7 and the memory cells Am may be in a low-resistance status when they are ruptured and may be in a high-resistance status when they are not ruptured. Therefore, when reading data stored in the first to eighth memory cells S0 to S7 and the memory cells Am, currents flowing through the bit line BLn and/or voltages of the bit line BLn may change according to the resistance statues of the first to eighth memory cells S0 to S7 and the memory cells Am. The nonvolatile memory apparatus 100 may include a column selection circuit 123. The column selection circuit 123 may select one among the plurality of bit lines included in the memory cell array 110, and may couple the selected bit line to a sensing node SN. For example, the column selection circuit 123 may select the bit line BLn based on an address signal and may couple the bit line BLn to the sensing node SN. When the bit line BLn is selected, the voltage level of the sensing node SN may change according to the voltage level of the bit line BLn.

The nonvolatile memory apparatus 100 may further include a data sensing circuit 130. The data sensing circuit 130 may generate an output signal SOUT by reading data stored in the first to eighth memory cells S0 to S7 of the first memory cell array 111 through the bit line BLn. The data sensing circuit 130 may define a plurality of operation periods and may read data stored in the memory cell array 110, after the nonvolatile memory apparatus 100 is powered-up. For example, the data sensing circuit 130 may define a sensing period and a latch period based on a power-up signal PWRUP. The latch period may be within the sensing period. The latch period may occur during the sensing period. The data sensing circuit 130 may sense and amplify data stored in the first to eighth memory cells S0 to S7 of the first memory cell array 111. The data sensing circuit 130 may precharge the sensing node SN. The driving force for precharging the sensing node SN may be smaller than the driving force for changing the voltage levels of the bit line BLn and the sensing node SN according to the data stored in the first to eighth memory cells S0 to S7. The data sensing circuit 130 may perform the precharge operation to prevent an abnormal change of the voltage level of the bit line BLn due to the gate leakage in the first to eighth memory cells S0 to S7. The data sensing circuit 130 may sense and amplify the voltage level changes of the bit line BLn and the sensing node SN due to the resistance values of the first to eighth memory cells S0 to S7 by performing the precharge operation with the driving force capable of compensating the gate leakage. The data sensing circuit 130 may generate the output signal SOUT by latching the signal that is sensed and amplified during the latch period.

The data sensing circuit 130 may include a boot-up control circuit 131, a sensing control signal generation circuit 132, and a first sense amplifier 133. The boot-up control circuit 131 may generate the power-up signal PWRUP by receiving a first power voltage VDD1. The first power voltage VDD1 may be a power voltage of a semiconductor apparatus including the nonvolatile memory apparatus 100 and may be provided by an external power source. When the first power voltage VDD1 is provided, the boot-up control circuit 131 may enable the power-up signal PWRUP by detecting whether the first power voltage VDD1 reaches a target level. For example, the power-up signal PWRUP may rise according to a level of the first power voltage VDD1 and may be enabled to a low level when the first power voltage VDD1 reaches a target level. The power-up signal PWRUP may indicate a start of a boot-up-operation period of the nonvolatile memory apparatus 100. In an embodiment, the boot-up control circuit 131 may receive a second power voltage VDD2 together with the first power voltage VDD1. The second power voltage VDD2 may be provided by an external power source or may be generated within the semiconductor apparatus. The second power voltage VDD2 may have a higher voltage level than the first power voltage VDD1. The boot-up control circuit 131 may detect whether the second power voltage VDD2 reaches another target level. In an embodiment, the boot-up control circuit 131 may enable the power-up signal PWRUP when both the first power voltage VDD1 and the second power voltage VDD2 reach their target levels. The boot-up control circuit 131 may generate a boot-up end signal MRSD at a predetermined time after the power-up signal PWRUP is enabled. The boot-up end signal MRSD may indicate an end of the boot-up-operation period of the nonvolatile memory apparatus 100. The predetermined time may be arbitrarily set.

The sensing control signal generation circuit 132 may receive the power-up signal PWRUP and the boot-up end signal MRSD. The sensing control signal generation circuit 132 may generate various sensing control signals based on the power-up signal PWRUP for the nonvolatile memory apparatus 100 to perform a read operation. The sensing control signal generation circuit 132 may disable any enabled sensing control signal based on the boot-up end signal MRSD. The sensing control signal generation circuit 132 may generate a sensing enable signal SEN and a latch enable signal LATEN based on the power-up signal PWRUP. The sensing enable signal SEN may define the sensing period and the latch enable signal LATEN may define the latch period. The sensing control signal generation circuit 132 may further generate a leakage signal VLEAK based on the power-up signal PWRUP. The sensing control signal generation circuit 132 may further generate a boot-up signal BOOTEN. The sensing control signal generation circuit 132 may generate the boot-up signal BOOTEN for a read operation from the second memory cell array 112 when a read operation from the first memory cell array 111 is completed.

The first sense amplifier 133 may read data stored in the first to eighth memory cells S0 to S7 of the first memory cell array 111 during the sensing period. The first sense amplifier 133 may read data stored in the first to eighth memory cells S0 to S7 while performing a precharge operation during the sensing period. When the first to eighth program signals SPG<0:7> are provided and the plurality of word lines SWL<0:7> are enabled for reading data stored in the first to eighth memory cells S0 to S7, gate leakage may occur in transistors forming the first to eighth memory cells S0 to S7. The first sense amplifier 133 may minimize the effect of the gate leakage introduced to the bit line BLn and perform a precise sensing operation by performing the precharge operation. The first sense amplifier 133 may be coupled to the first memory cell array 111 and the bit line BLn through the sensing node SN. The first sense amplifier 133 may receive the sensing enable signal SEN and the latch enable signal LATEN. The first sense amplifier 133 may sense and amplify the voltage level of the sensing node SN, which changes according to the voltage level of the bit line BLn, while precharging the sensing node SN based on the sensing enable signal SEN.

The data sensing circuit 130 may further include a second sense amplifier 134. The second sense amplifier 134 may read data stored in the memory cells Am of the second memory cell array 112. The second sense amplifier 134 may read data stored in the memory cells Am of the second memory cell array 112 through the sensing node SN and the bit line BLn. The second sense amplifier 134 may receive the boot-up signal BOOTEN. The second sense amplifier 134 may perform a read operation from the second memory cell array 112 based on the boot-up signal BOOTEN.

Figure 2:
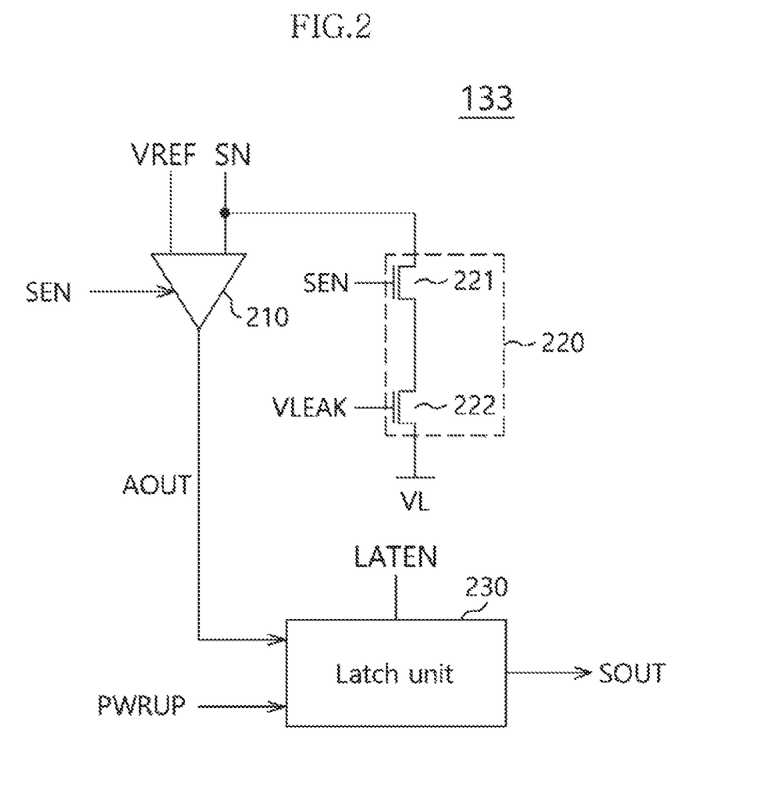
FIG. 2 shows a diagram illustrating a configuration of a first sense amplifier illustrated in FIG. 1.

FIG. 2 shows a diagram illustrating a configuration of the first sense amplifier 133 illustrated in FIG. 1. Referring to FIG. 2, the first sense amplifier 133 may include an amplification unit 210, a leaker unit 220, and a latch unit 230. The amplification unit 210 may generate an amplification signal AOUT by sensing and amplifying the voltage level of the sensing node SN based on the sensing enable signal SEN. The amplification unit 210 may be coupled to the sensing node SN and may receive a reference voltage VREF. The reference voltage VREF may have a predetermined voltage level for determining data stored in the first to eighth memory cells S0 to S7. The amplification unit 210 may generate the amplification signal AOUT by comparing the voltage level of the sensing node SN with the reference voltage VREF when activated on the basis of the sensing enable signal SEN.

The leaker unit 220 may precharge the sensing node SN based on the sensing enable signal SEN. When the sensing enable signal SEN is enabled, the leaker unit 220 may precharge the voltage level of the sensing node SN by driving the sensing node SN to the low voltage VL. The low voltage VL may have a lower level than the first power voltage VDD1 and may be, for example, the ground voltage. The leaker unit 220 may further receive the leakage signal VLEAK and may precharge the sensing node SN based on the sensing enable signal SEN and the leakage signal VLEAK. The leaker unit 220 may include a first transistor 221 and a second transistor 222. The first transistor 221 and the second transistor 222 may be N-channel MOS transistors. The first transistor 221 may receive the sensing enable signal SEN at its gate and may be coupled to the sensing node SN at its drain. The second transistor 222 may receive the leakage signal VLEAK at its gate, may be coupled to a source of the first transistor 221 at its drain, and may be coupled to the low voltage VL at its source.

The latch unit 230 may receive the latch enable signal LATEN and the amplification signal AOUT and may generate the output signal SOUT. The latch unit 230 may latch the amplification signal AOUT based on the latch enable signal LATEN and may output the latched signal as the output signal SOUT. The latch unit 230 may further receive the power-up signal PWRUP. The latch unit 230 may be initialized and may initialize the level of the output signal SOUT, when the power-up signal PWRUP is enabled. The latch unit 230 may generate the output signal SOUT by latching the voltage level of the amplification signal AOUT when the latch enable signal LATEN is enabled.

Figure 3:
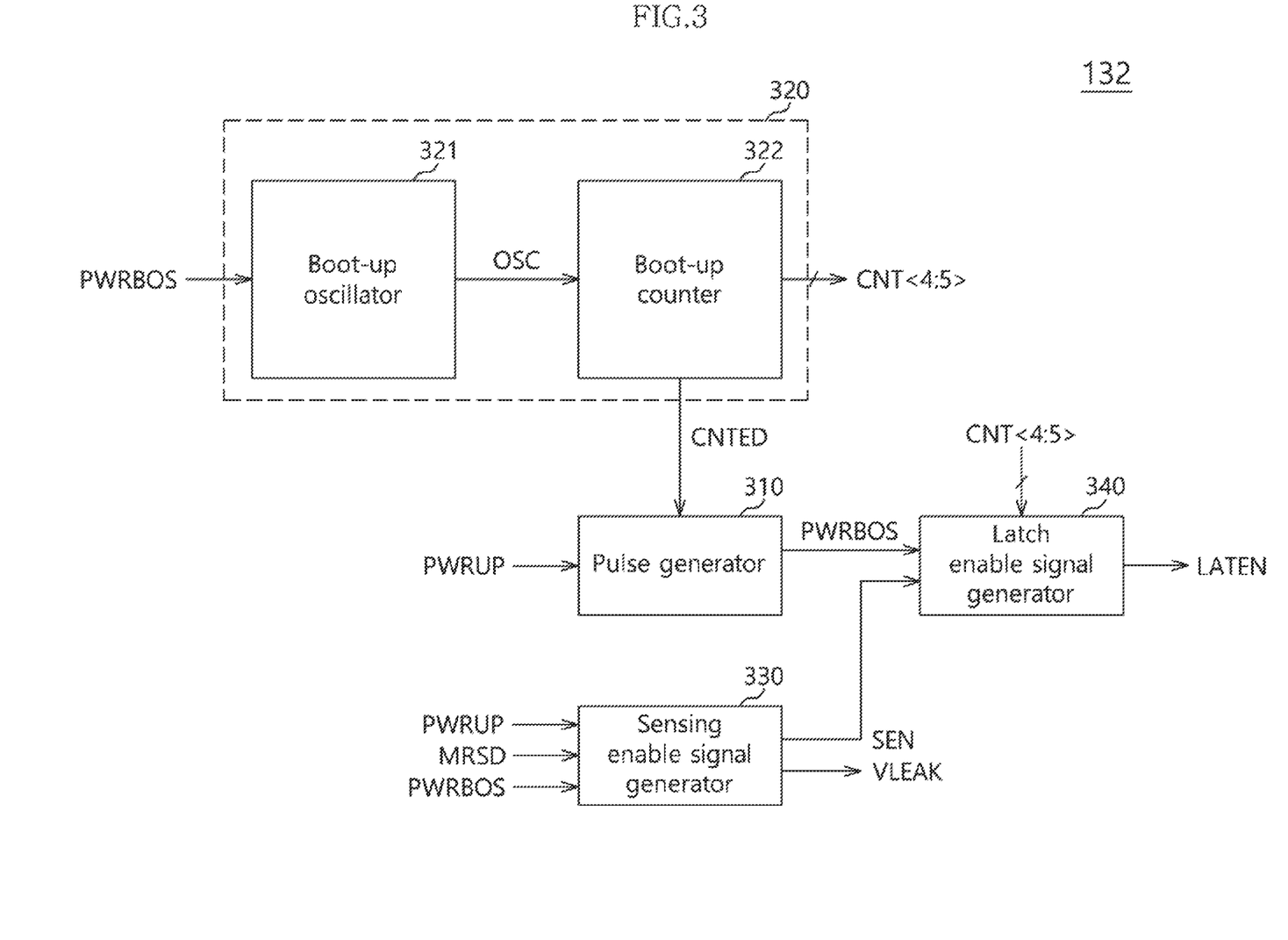
FIG. 3 shows a diagram illustrating a configuration of a sensing control signal generation circuit illustrated in FIG. 1.

FIG. 3 shows a diagram illustrating a configuration of the sensing control signal generation circuit 132 illustrated in FIG. 1. Referring to FIG. 3, the sensing control signal generation circuit 132 may include a pulse generator 310, a timing control signal generator 320, a sensing enable signal generator 330, and a latch enable signal generator 340. The pulse generator 310 may receive the power-up signal PWRUP. The pulse generator 310 may generate a control pulse signal PWRBOS based on the power-up signal PWRUP. The pulse generator 310 may further receive a counting end signal CNTED. The pulse generator 310 may enable the control pulse signal PWRBOS when the power-up signal PWRUP is enabled, and may disable the control pulse signal PWRBOS when the counting end signal CNTED is enabled.

The timing control signal generator 320 may receive the control pulse signal PWRBOS and may generate timing control signals CNT<4:5>. The timing control signals CNT<4:5> may define the latch period and may define timings of enabling and disabling the latch enable signal LATEN. The timing control signals CNT<4:5> may include a first timing control signal CNT<4> and a second timing control signal CNT<5>. The timing control signal generator 320 may perform a counting operation when the control pulse signal PWRBOS is enabled and may generate the timing control signals CNT<4:5> according to the result of the counting operation. The timing control signal generator 320 may include a boot-up oscillator 321 and a boot-up counter 322. The boot-up oscillator 321 may receive the control pulse signal PWRBOS and may generate an oscillating signal OSC. The boot-up oscillator 321 may generate the oscillating signal OSC, which toggles periodically, such as a clock signal, while the control pulse signal PWRBOS is enabled. The boot-up counter 322 may receive the oscillating signal OSC and may generate the first timing control signal CNT<4>, the second timing control signal CNT<5>, and the counting end signal CNTED. The boot-up counter 322 may generate the first timing control signal CNT<4> and the second timing control signal CNT<5> by counting the oscillating signal OSC. The boot-up counter 322 may generate the first timing control signal CNT<4> and the second timing control signal CNT<5> by counting a number of toggles of the oscillating signal OSC. For example, the boot-up counter 322 may generate the first timing control signal CNT<4> when the oscillating signal OSC toggles four times and may generate the second timing control signal CNT<5> when the oscillating signal OSC toggles five times. The boot-up counter 322 may enable the counting end signal CNTED when the oscillating signal OSC toggles a predetermined number of times (e.g., six times or more).

The sensing enable signal generator 330 may receive the power-up signal PWRUP and the control pulse signal PWRBOS and may generate the sensing enable signal SEN. The sensing enable signal generator 330 may enable the sensing enable signal SEN based on the power-up signal PWRUP and the control pulse signal PWRBOS. For example, the sensing enable signal generator 330 may output the control pulse signal PWRBOS as the sensing enable signal SEN when the power-up signal PWRUP is enabled. The enable period of the sensing enable signal SEN may be substantially the same as the enable period of the control pulse signal PWRBOS. The sensing enable signal generator 330 may further receive the boot-up end signal MRSD and may further generate the leakage signal VLEAK. For example, the sensing enable signal generator 330 may enable the leakage signal VLEAK when the power-up signal PWRUP is enabled and may disable the leakage signal VLEAK when the boot-up end signal MRSD is enabled.

The latch enable signal generator 340 may receive the control pulse signal PWRBOS, the sensing enable signal SEN, and the timing control signals CNT<4:5> and may generate the latch enable signal LATEN. The latch enable signal generator 340 may enable the latch enable signal LATEN based on the control pulse signal PWRBOS, the sensing enable signal SEN, and the timing control signals CNT<4:5>. For example, the latch enable signal generator 340 may enable the latch enable signal LATEN during a period defined by the timing control signals CNT<4:5> when the control pulse signal PWRBOS and the sensing enable signal SEN are enabled. The latch enable signal generator 340 may enable the latch enable signal LATEN based on the first timing signal CNT<4> and may disable the latch enable signal LATEN based on the second timing signal CNT<5>.

Figure 4:
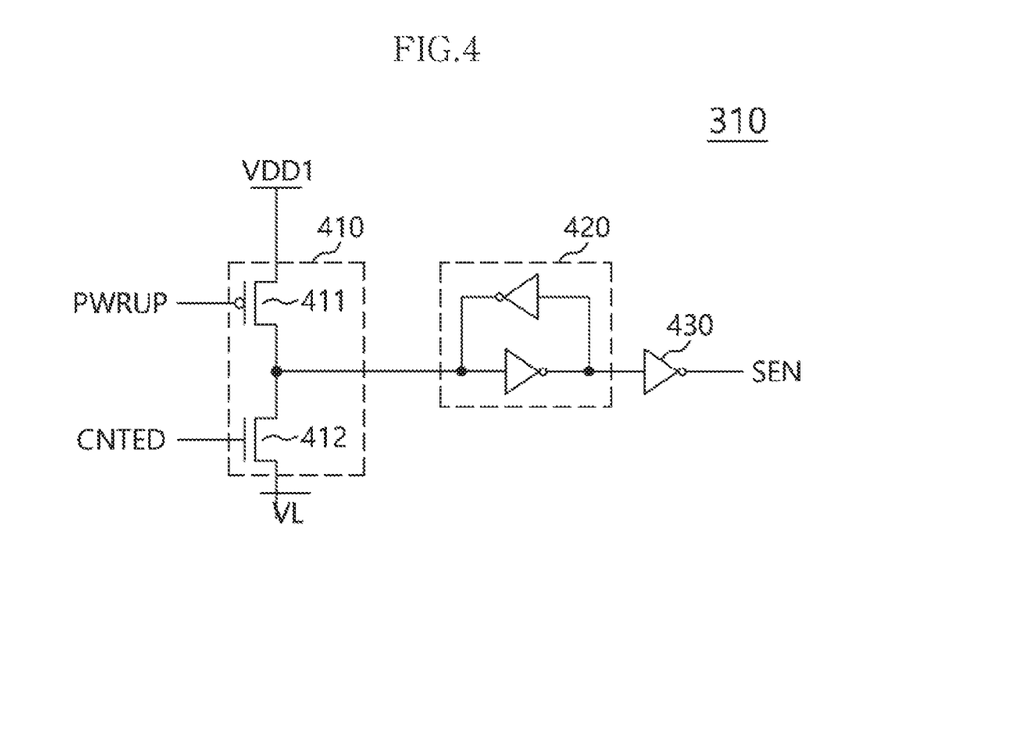
FIG. 4 shows a diagram illustrating a configuration of a pulse generator illustrated in FIG. 3.

FIG. 4 shows a diagram illustrating a configuration of the pulse generator 310 illustrated in FIG. 3. Referring FIG. 4, the pulse generator 310 may include an enable driver 410, an inversion latch 420, and an inverter 430. The enable driver 410 may include a first transistor 411 and a second transistor 412. For example, the first transistor 411 may be a P-channel MOS transistor and the second transistor 412 may be an N-channel MOS transistor. The first transistor 411 may receive the power-up signal PWRUP at its gate and may receive the first power voltage VDD1 at its source. The second transistor 412 may receive the counting end signal CNTED at its gate, may be coupled to a drain of the first transistor 411 at its drain, and may be coupled to the low voltage VL at its source. The inversion latch 420 may be coupled to the drains of the first transistor 411 and the second transistor 412. The inversion latch 420 may invert the signal output from the drains of the first transistor 411 and the second transistor 412 and may keep the level of the inverted signal. The inverter 430 may generate the control pulse signal PWRBOS by inverting the signal output from the inversion latch 420. When the power-up signal PWRUP is enabled to a low level, the first transistor 411 of the enable driver 410 may apply the first power voltage VDD1 to a node coupled to its drain, and the inversion latch 420 and the inverter 430 may enable the control pulse signal PWRBOS to a high level. When the counting end signal CNTED is enabled to a high level, the second transistor 412 of the enable driver 410 may drive a node coupled to its drain to the low voltage VL, and the inversion latch 420 and the inverter 430 may disable the control pulse signal PWRBOS to a low level.

Figure 5:
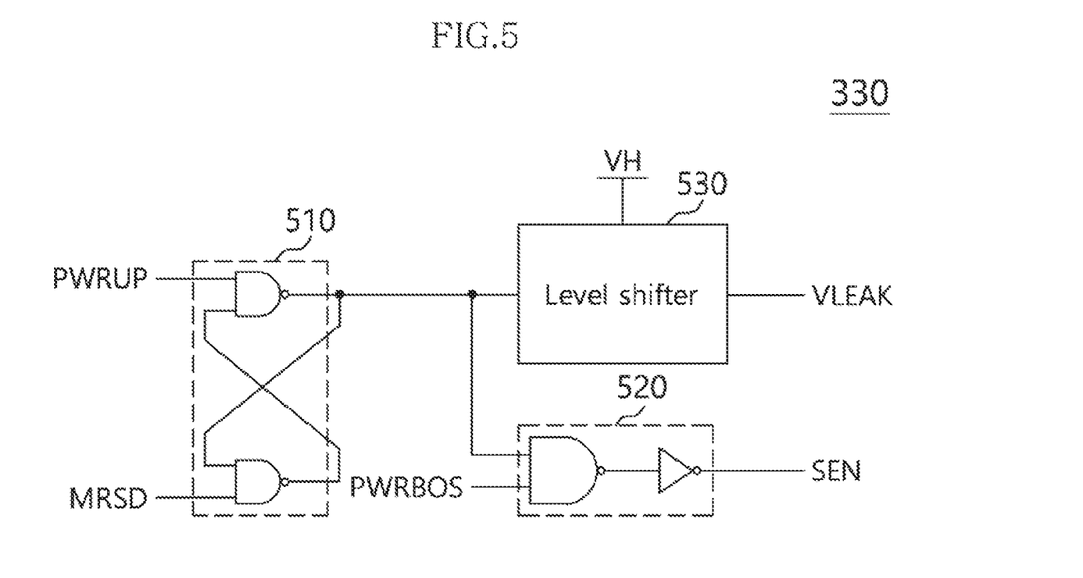
FIG. 5 shows a diagram illustrating a configuration of a sensing enable signal generator illustrated in FIG. 3.

FIG. 5 shows a diagram illustrating a configuration of the sensing enable signal generator 330 illustrated in FIG. 3. Referring to FIG. 5, the sensing enable signal generator 330 may include a SR latch 510, an AND gate 520, and a level shifter 530. The SR latch 510 may receive the power-up signal PWRUP at its set node and may receive the boot-up end signal MRSD at its reset node. The SR latch 510 may output an output signal having a high level when the power-up signal PWRUP is enabled and may output the output signal having a low level when the boot-up end signal MRSD is enabled. The AND gate 520 may receive the output signal of the SR latch 510 and the control pulse signal PWRBOS. The AND gate 520 may enable the sensing enable signal SEN to a high level when the output signal of the SR latch 510 has a high level and the control pulse signal PWRBOS is enabled to a high level. The level shifter 530 may receive the output signal of the SR latch 510 and may generate the leakage signal VLEAK. The level shifter 530 may use a high voltage VH as a power voltage. For example, the high voltage VH may have a level lower than the first power voltage VDD1 and higher than the low voltage VL. The level shifter 530 may generate the leakage signal VLEAK by shifting the output signal of the SR latch 510 to the level of the high voltage VH. The level shifter 530 may adjust the precharge driving force of the leaker unit 220 to the sensing node SN by generating the leakage signal VLEAK having the level of the high voltage VH, which is lower than the first power voltage VDD1.

Figure 6:
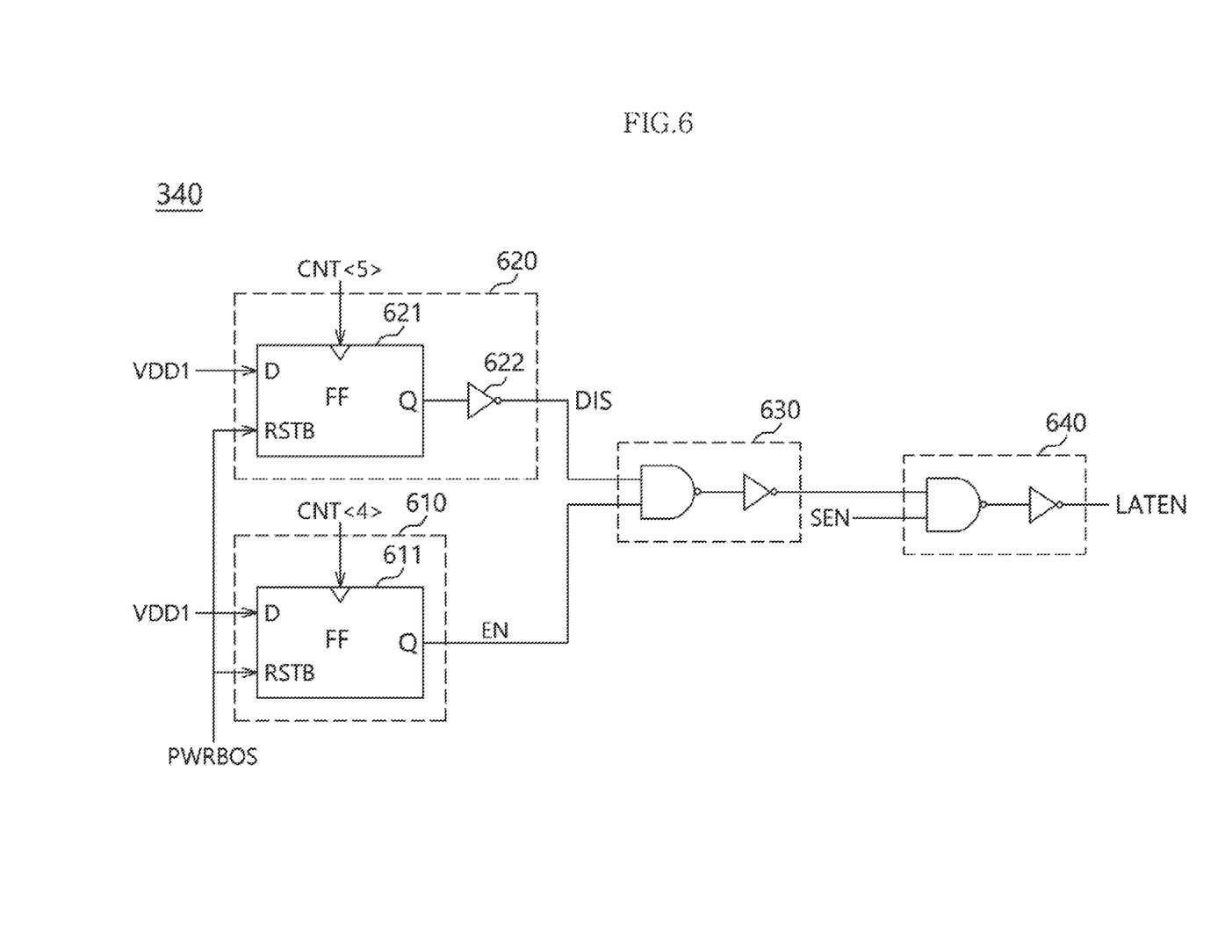
FIG. 6 shows a diagram illustrating a configuration of a latch enable signal generator illustrated in FIG. 3.

FIG. 6 shows a diagram illustrating a configuration of the latch enable signal generator 340 illustrated in FIG. 3. The latch enable signal generator 340 may include an enable controller 610, a disable controller 620, a first AND gate 630, and a second AND gate 640. The enable controller 610 may receive the control pulse signal PWRBOS and the first timing signal CNT<4>. The enable controller 610 may be initialized by the control pulse signal PWRBOS and may output an enable control signal EN based on the first timing signal CNT<4>. The enable controller 610 may include a first flip-flop 611. The first flip-flop 611 may receive the first power voltage VDD1 at its input node, may receive the control pulse signal PWRBOS at its reset node, and may receive the first timing signal CNT<4>at its clock node. The first flip-flop 611 may initialize the level of the enable control signal EN to a low level when the control pulse signal PWRBOS is enabled. The first flip-flop 611 may allow the enable control signal EN to be enabled to a high level by outputting the first power voltage VDD1 as the enable control signal EN when the first timing signal CNT<4>is enabled.

The disable controller 620 may receive the control pulse signal PWRBOS and the second timing signal CNT<5>. The disable controller 620 may be initialized by the control pulse signal PWRBOS and may output a disable control signal DIS based on the second timing signal CNT<5>. The disable controller 620 may include a second flip-flop 621 and an inverter 622. The second flip-flop 621 may receive the first power voltage VDD1 at its input node, may receive the control pulse signal PWRBOS at its reset node, and may receive the second timing signal CNT<5>at its clock node. The second flip-flop 621 may initialize a signal output from an output node to a low level when the control pulse signal PWRBOS is enabled. The second flip-flop 621 may output a signal having a high level through the output node by outputting the first power voltage VDD1 as the disable control signal DIS when the second timing signal CNT<5>is enabled. The inverter 622 may generate the disable control signal DIS by inverting the output of the second flip-flop 621. The disable controller 620 may disable the disable control signal DIS to a high level when the output of the second flip-flop 621 has a low level and may enable the disable control signal DIS to a low level when the output of the second flip-flop 621 has a high level.

The first AND gate 630 may receive the enable control signal EN and the disable control signal DIS. The first AND gate 630 may output an output signal having a high level when the enable control signal EN is enabled to a high level and may output the output signal having a low level when the disable control signal DIS is disabled to a low level. The second AND gate 640 may receive the output of the first AND gate 630 and the sensing enable signal SEN. The second AND gate 640 may output the output of the first AND gate 630 as the latch enable signal LATEN when the sensing enable signal SEN is enabled to a high level. Therefore, the latch enable signal LATEN may be enabled from when the enable control signal EN is enabled to when the disable control signal DIS is enabled.

Figure 7:
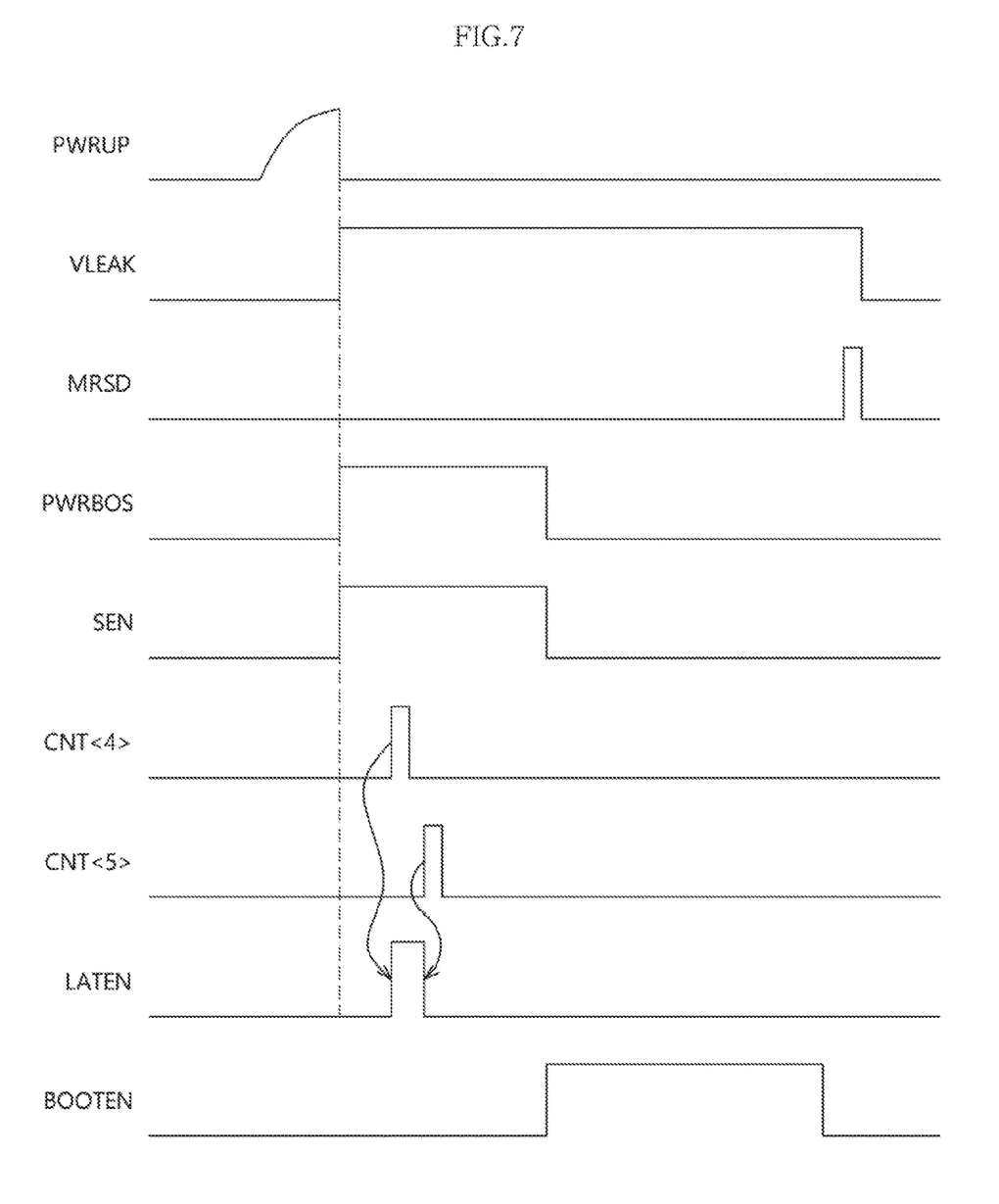
FIG. 7 shows a timing diagram illustrating an operation of a nonvolatile memory apparatus, in accordance with an embodiment of the present disclosure.

FIG. 7 shows a timing diagram illustrating an operation of the nonvolatile memory apparatus 100 in accordance with an embodiment of the present disclosure. Hereinafter, an operation of the nonvolatile memory apparatus 100, in accordance with an embodiment, is described with reference to FIGS. 1 to 7. When the power-up signal PWRUP is enabled as the nonvolatile memory apparatus 100 is powered on, the nonvolatile memory apparatus 100 may perform a boot-up operation. The boot-up control circuit 131 may enable the power-up signal PWRUP by detecting the level of the first power voltage VDD1. When the power-up signal PWRUP is enabled, the sensing enable signal generator 330 may enable the leakage signal VLEAK. The pulse generator 310 may enable the control pulse signal PWRBOS based on the power-up signal PWRUP. When the control pulse signal PWRBOS is enabled, the boot-up oscillator 321 may generate the oscillating signal OSC and the boot-up counter 322 may generate the first timing control signal CNT<4>and the second timing control signal CNT<5>by counting the oscillating signal OSC.

The sensing enable signal generator 330 may enable the sensing enable signal SEN based on the control pulse signal PWRBOS. The leaker unit 220 may precharge the sensing node SN to the low voltage VL based on the sensing enable signal SEN and the leakage signal VLEAK. The first row selection circuit 121 may further receive the sensing enable signal SEN and may enable all of the first to eighth program signals SPG<0:7>and the plurality of word lines SWL<0: 7>based on the sensing enable signal SEN. Therefore, a current may flow through the bit line BLn according to resistance values of the first to eighth memory cells S0 to S7 of the first memory cell array 111, and the voltage level of the sensing node SN may change based on the current flowing through the bit line BLn. For example, when the resistance values of the first to eighth memory cells S0 to S7 are set and/or programmed for the first to eighth memory cells S0 to S7 to have low resistance values, the voltage level of the sensing node SN may increase. The amplification unit 210 may generate the amplification signal AOUT by comparing the voltage level of the sensing node SN with the reference voltage VREF. For example, when the resistance values of the first to eighth memory cells S0 to S7 are set to be low, the driving force for changing the voltage level of the bit line BLn may be stronger than the precharge driving force of the leaker unit 220 and the voltage level of the sensing node SN may increase. The amplification unit 210 may generate the amplification signal AOUT having a high level when the voltage level of the sensing node SN is higher than the level of the reference voltage VREF.

The latch enable signal generator 340 may initialize the latch enable signal LATEN to a low level when the control pulse signal PWRBOS is enabled. The latch enable signal generator 340 may enable the latch enable signal LATEN when the first timing signal CNT<4>is enabled. The latch enable signal generator 340 may disable the latch enable signal LATEN when the second timing signal CNT<5>is enabled. The sensing enable signal SEN may be enabled when the control pulse signal PWRBOS is enabled and may be disabled when the control pulse signal PWRBOS is disabled. On the other hand, the latch enable signal LATEN may be enabled when the first timing signal CNT<4>is enabled and may be disabled when the second timing signal CNT<5>is enabled, after the control pulse signal PWRBOS is enabled. That is, the latch enable signal LATEN may be generated in the period, in which the sensing enable signal SEN is enabled, and may be enabled a predetermined time after the sensing enable signal SEN is enabled. When the sensing enable signal SEN is enabled, the leaker unit 220 may precharge the sensing node SN and the voltage level of the sensing node SN may change according to the resistance statuses of the first to eighth memory cells S0 to S7. Therefore, the amplification unit 210 may precisely detect the resistance statuses of the first to eighth memory cells S0 to S7 and may generate the amplification signal AOUT, before the latch enable signal LATEN is enabled. Therefore, the latch unit 230 may latch the amplification signal AOUT based on the latch enable signal LATEN and may generate the output signal SOUT, after the resistance statuses of the first to eighth memory cells S0 to S7 are precisely detected. In an embodiment, the latch unit 230 may generate the output signal SOUT based on the latch enable signal LATEN, which is separated from the sensing enable signal SEN, and thus the latch unit 230 might not be required to be disposed as adjacent to the memory cell array 110 of the nonvolatile memory apparatus 100. Further, the latch unit 230 may use a smaller number of control signals, and thus the circuit design of the latch unit 230 may be easy and the circuit area of the latch unit 230 may be drastically reduced.

When the output signal SOUT is generated, a voltage level may be set for programming the memory cells Am of the second memory cell array 112 or for reading data stored in the memory cells Am of the second memory cell array 112, based on the output signal SOUT. When the counting end signal CNTED is generated from the boot-up counter 322, the control pulse signal PWRBOS may be disabled and the boot-up signal BOOTEN may be enabled. When the boot-up signal BOOTEN is enabled, the second sense amplifier 134 may read data stored in the memory cells Am of the second memory cell array 112 based on the voltage level, which is set on the basis of the output signal SOUT. After that, when the boot-up end signal MRSD is enabled, the boot-up operation of the nonvolatile memory apparatus 100 may end. After the end of the boot-up operation, when required, a rupture operation and/or a program operation may be performed to the memory cells Am of the second memory cell array 112.

The embodiments presented above serve as a limited number of examples among a larger number of possible examples. Accordingly, the nonvolatile memory apparatus, data sensing circuit, and method should not be limited based on the described embodiments. Rather, the nonvolatile memory apparatus, data sensing circuit, and method described herein should only be limited in light of the claims that follow when taken in conjunction with the above description and accompanying drawings.

What is claimed is:

1. A nonvolatile memory apparatus comprising:
    a first memory cell array including a plurality of first memory cells coupled between a first of first word lines and a bit line;
    a second memory cell array including a plurality of second memory cells coupled between a plurality of second word lines and the bit line; and
    a data sensing circuit configured to define a sensing period and a latch period based on a power-up signal, to continuously precharge a sensing node coupled to the bit line during the sensing period, to amplify a voltage level of the sensing node during the sensing period, and to generate an output signal by latching the amplified signal during the latch period.

2. The nonvolatile memory apparatus of claim 1, wherein the latch period is within the sensing period.

3. The nonvolatile memory apparatus of claim 1, wherein the data sensing circuit comprises:
    a sensing control signal generation circuit configured to generate, based on the power-up signal, a sensing enable signal for defining the sensing period and a latch enable signal for defining the latch period; and
    a first sense amplifier configured to generate the output signal based on the sensing enable signal and the latch enable signal.

4. The nonvolatile memory apparatus of claim 3, wherein the sensing control signal generation circuit comprises:
    a pulse generator configured to generate a control pulse signal based on the power-up signal;
    a timing control signal generator configured to generate timing control signals based on the control pulse signal;
    a sensing enable signal generator configured to generate the sensing enable signal based on the power-up signal and the control pulse signal; and
    a latch enable signal generator configured to generate the latch enable signal based on the control pulse signal, the sensing enable signal, and the timing control signals.

5. The nonvolatile memory apparatus of claim 4, wherein the timing control signal generator comprises:
    a boot-up oscillator configured to generate an oscillating signal based on the control pulse signal; and
    a boot-up counter configured to generate the timing control signals by counting the oscillating signal.

6. The nonvolatile memory apparatus of claim 5,
    wherein the timing control signal generator is further configured to generate a counting end signal by counting the oscillating signal, and
    wherein the sensing control signal generation circuit is further configured to generate a boot-up signal based on the counting end signal.

7. The nonvolatile memory apparatus of claim 6, further comprising a second sense amplifier configured to couple to the bit line, based on the boot-up signal, and to read data stored in the plurality of second memory cells of the second memory cell array.

8. The nonvolatile memory apparatus of claim 4,
    wherein the timing control signals comprise a first timing control signal and a second timing control signal, and
    wherein the latch enable signal generator is further configured to enable the latch enable signal based on the first timing control signal and to disable the latch enable signal based on the second timing control signal.

9. The nonvolatile memory apparatus of claim 3, wherein the first sense amplifier comprises:
    a leaker unit configured to precharge a voltage level of the sensing node based on the sensing enable signal;
    an amplification unit configured to generate an amplification signal by comparing the voltage level of the sensing node with a voltage level of a reference voltage based on the sensing enable signal; and
    a latch unit configured to generate the output signal by latching the amplification signal based on the latch enable signal.

10. An operating method of a nonvolatile memory apparatus comprising a first memory cell array coupled to a sensing node through a bit line, the operating method comprising:
    generating a sensing enable signal based on a power-up signal;
    generating an amplification signal by comparing a voltage level of the sensing node with a reference voltage based on the sensing enable signal;
    precharging the sensing node together with generating the amplification signal;
    generating a latch enable signal, which is enabled within an enable period of the sensing enable signal; and
    generating an output signal by latching the amplification signal based on the latch enable signal.

11. The operating method of claim 10, wherein generating the latch enable signal comprises:
    generating an oscillating signal based on the power-up signal and generating first and second timing control signals by counting the oscillating signal; and enabling the latch enable signal based on the first timing control signal and disabling the latch enable signal based on the second timing control signal.

12. The operating method of claim 10,
wherein the nonvolatile memory apparatus further comprises a second memory cell array coupled to the sensing node through the bit line,
further comprising reading data stored in the second memory cell array after the generating of the output signal.

\* \* \* \* \*